(12) United States Patent
Lee et al.

(10) Patent No.: US 9,941,879 B2
(45) Date of Patent: Apr. 10, 2018

(54) KEY INCLUDING CAPACITIVE SENSOR

(71) Applicant: SYNAPTICS INCORPORATED, San Jose, CA (US)

(72) Inventors: Wei-Lung Lee, Taipei (TW); Shridhar R. Dessai, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 741 days.

(21) Appl. No.: 14/524,043

(22) Filed: Oct. 27, 2014

(65) Prior Publication Data

US 2016/0118982 A1 Apr. 28, 2016

(51) Int. Cl.
H03K 17/94 (2006.01)
H03K 17/98 (2006.01)

(52) U.S. Cl.
CPC ..... H03K 17/98 (2013.01); *H03K 2217/9651* (2013.01); *H03K 2217/960775* (2013.01)

(58) Field of Classification Search
CPC ....... H03K 17/98; H03K 2217/960775; H03K 2217/9651
See application file for complete search history.

(56) References Cited

U.S. PATENT DOCUMENTS

| | | | |
|---|---|---|---|
| 3,665,126 A | 5/1972 | Gabor | |
| 4,901,074 A * | 2/1990 | Sinn | F24C 7/082 200/5 A |
| 5,341,133 A | 8/1994 | Savoy et al. | |
| 7,659,887 B2 | 2/2010 | Larsen et al. | |
| 8,207,872 B2 | 6/2012 | Huang et al. | |
| 8,451,228 B2 | 5/2013 | Chuang et al. | |
| 2001/0013859 A1* | 8/2001 | Roylance | G06F 3/0219 345/168 |
| 2002/0030666 A1 | 3/2002 | Philipp | |
| 2005/0030048 A1 | 2/2005 | Bolender et al. | |
| 2006/0181511 A1 | 8/2006 | Woolley | |
| 2008/0145127 A1 | 6/2008 | Liu | |
| 2009/0091535 A1 | 4/2009 | Ure | |
| 2009/0295733 A1 | 12/2009 | Stenbroten | |
| 2010/0026626 A1 | 2/2010 | Macfarlane | |
| 2010/0156832 A1 | 6/2010 | Vargas | |
| 2010/0253630 A1 | 10/2010 | Homma et al. | |
| 2012/0144337 A1 | 6/2012 | Archer et al. | |
| 2012/0146919 A1* | 6/2012 | Kim | G06F 3/044 345/173 |
| 2012/0242578 A1 | 9/2012 | Laubach | |

(Continued)

OTHER PUBLICATIONS

Korean International Searching Authority, International Search Report and Written Opinion for International Application No. PCT/US2014/034268 dated Aug. 7, 2014.

*Primary Examiner* — Omeed Alizada
(74) *Attorney, Agent, or Firm* — FBFK PC

(57) ABSTRACT

A keyboard input device including a plurality of key assemblies, at least one of the key assemblies comprising: a key cap having a top surface configured to be pressed by a user; a rigid conductive substrate (e.g., metal) coupled to a bottom surface of the key cap; a translation mechanism configured to allow translation of the key responsive to user input; and a capacitive sensor substrate disposed between the key cap and the rigid conductive substrate, the capacitive sensor substrate comprising a plurality of sensor electrodes configured to detect input objects in a sensing region of the key assembly.

17 Claims, 8 Drawing Sheets

(56) References Cited

U.S. PATENT DOCUMENTS

| | | |
|---|---|---|
| 2012/0299832 A1 | 11/2012 | Peterson et al. |
| 2013/0063286 A1 | 3/2013 | Elias et al. |
| 2013/0335327 A1* | 12/2013 | Solomon ............... G06F 1/1662 345/168 |
| 2014/0028564 A1 | 1/2014 | Valentine et al. |
| 2014/0267128 A1* | 9/2014 | Bulea ..................... G06F 3/044 345/174 |

\* cited by examiner

KEY INCLUDING CAPACITIVE SENSOR

FIELD OF THE INVENTION

This invention generally relates to electronic devices, and more particularly to a keyboard key having an integral capacitive sensor for sensing the location of the finger on the surface of the key cap.

BACKGROUND OF THE INVENTION

Pressable touchsurfaces (touch surfaces which can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key and the amount of key displacement (movement relative to its unpressed position). The force applied to the user may be a total force or the portion of the total force along a particular direction such as the positive or negative press direction. Similarly, the amount of key displacement may be a total amount of key travel or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e., "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

Presently known keyboard keys typically include attachment features, such as hooks, formed on underside of the key for attachment to planar translation mechanisms such as ramps, 4-bar linkages, and scissor mechanisms. When a capacitive sensor substrate is attached to the underside of the key cap, the sensor substrate typically includes voids through which the attachment features extend, resulting in local non-uniformities in the capacitive response of the sensor.

Methods and apparatus are thus needed which overcome these shortcomings.

BRIEF SUMMARY OF THE INVENTION

Capacitive touch sensors are provided which allow multiple input functions on a single key, for example on extended (wide) keys such as the spacebar, Enter, and Shift keys. This may be accomplished by determining the location of the finger (or other input modality) on the surface of the key during a keystroke. Corresponding legends may be used to demark one or more locations (regions) on the surface of an extended key. This eliminates the need to physically split extended keys such as the spacebar into multiple keys in order to provide multiple input functions.

A key assembly includes a continuous (substantially uninterrupted) capacitive touch sensor substrate sandwiched between the underside of the key cap and a film metal substrate. By eliminating the rigidity elements and attachment features from the underside of the key cap, the sensor substrate may be closely adhered to the key cap undersurface. The attachment features and rigidity elements previously associated with the key cap undersurface are integrated into the film metal. In addition, the film metal may be grounded or otherwise maintained at a constant voltage potential, effectively isolating the sensor substrate from unwanted electrical interference with other electrical components.

BRIEF DESCRIPTION OF DRAWINGS

Example embodiments of the present invention will hereinafter be described in conjunction with the appended drawings which are not to scale unless otherwise noted, where like designations denote like elements, and.

DETAILED DESCRIPTION OF THE INVENTION

Figure 1:
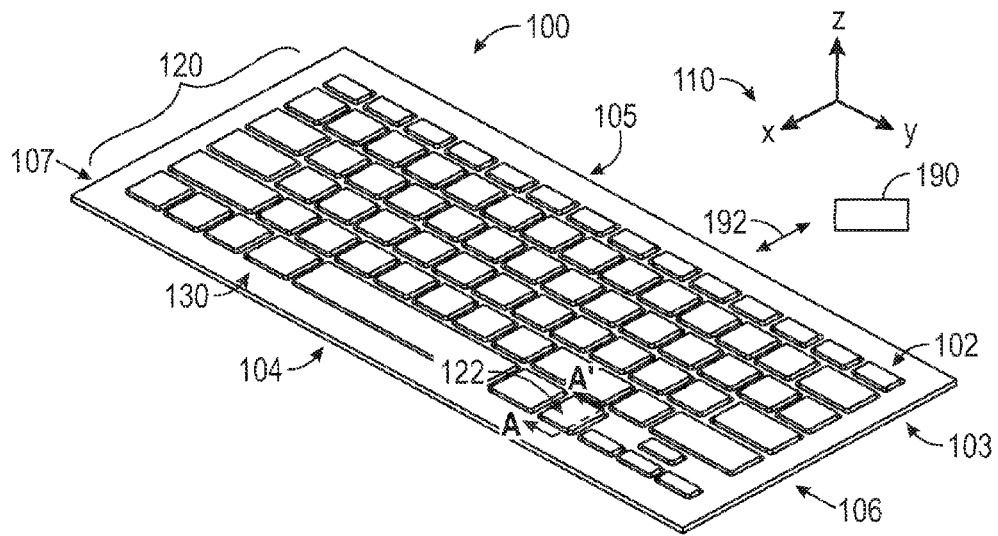
FIG. 1 shows an example keyboard that incorporates one or more implementations of key-based touchsurfaces configured in accordance with the techniques described herein.

The following detailed description is merely exemplary in nature and is not intended to limit the invention or the application and uses of the invention.

Keyboard keys often include attachment features (e.g. hooks, mating features, etc.) extending from the underside of the key for attaching various mechanisms which facilitate keystroke motion. These mechanisms may include ramps and four bar linkages in thin touch applications, and may include scissor mechanisms in more traditional keyboard applications. Wider keys such as the space bar and shift keys may also include hooks for snap-in wires to enhance the overall rigidity of the key assembly.

In some applications it is desirable to adhere a conformal capacitive touch sensor substrate to the underside of a key cap to sense finger location on one or more regions of the key cap surface, particularly for wide keys such as the space bar or shift key. This requires that the sensor substrate include holes through which the aforementioned hooks extend to facilitate the attachment of key motion linkages and rigidity elements. These discontinuities in the sensor substrate can produce local non-uniformities in the capacitive response of the touch sensor.

To alleviate sensor substrate non-uniformities, various embodiments provide a sensor substrate which is continuous (i.e., free from discontinuities) and a key cap having a smooth, continuous bottom surface devoid of the hooks associated with presently known key caps. This arrangement allows the sensor substrate to closely adhere to the underside of the key cap, resulting in a uniform capacitive response to finger presence across the top surface of the key. A film metal substrate is placed over the sensor substrate, such that the sensor substrate is sandwiched between the underside of the key cap and the film metal. In order to accommodate the attachment of key motion linkages, the film metal substrate includes the attachment features, extensions, and rigidity elements previously associated with the underside of the key cap.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprise other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

FIG. 1 shows an example keyboard 100 that incorporates a plurality of (two or more) pressable key-based touchsurfaces configured in accordance with the techniques described herein. The example keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction as explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the example keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touchsurfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a component having the touchsurface, modulates that sensor electrodes with respect to a reference voltage (e.g., system ground), and detects the capacitive coupling between that sensor electrode and the component having the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a touchsurface, one transmitter and one receiver. The resulting signal received by the receiver is affected by the transmitter signal and the location of the touchsurface.

In some embodiments, the sensor system used to detect touchsurface presses may also detect pre-presses. For example, a capacitive sensor system may also be able to detect a user hovering over but not contacting a touch surface. As another example, a capacitive sensor system may be able to detect a user lightly touching a touchsurface, such that the user performs a non-press contact on the touchsurface, and does not depress the touchsurface sufficiently to be considered a press.

Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s). These types of systems can support multi-stage touchsurface input by distinguishing and responding differently to two or more of the following: non-contact hover, non-press contact, and one, two, or more levels of press.

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be communicably coupled with a processing system 190 through communications channel 192. Connection 192 may be wired or wireless. The processing system 190 may comprise one or more ICs (integrated circuits) having appropriate processor-executable instructions for operating the keyboard 100, such as instructions for operating key press sensors, processing sensor signals, responding to key presses, and the like. In some embodiments, the keyboard 100 is integrated in a laptop computer or a tablet computer cover, and the processing system 190 comprises an IC containing instructions to operate keyboard sensors to determine the extent keys has been touched or pressed, and to provide an indication of touch or press status to a main CPU of the laptop or tablet computer, or to a user of the laptop or tablet computer.

While the orientation terminology, vertical-lateral travel, sensing technology, and implementation options discussed here focuses on the keyboard 100, these discussions are readily analogized to other touchsurfaces and devices described herein.

Figure 2:
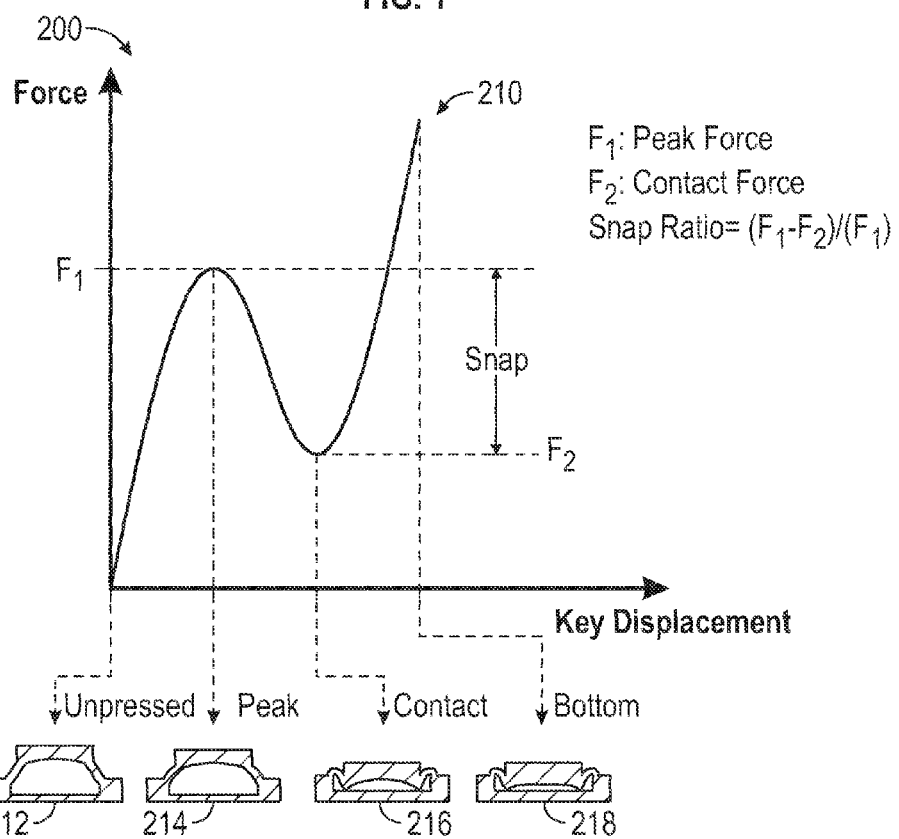
FIG. 2 is a graph of an example tactile response that is characteristic of many keys enabled with metal snap domes or rubber domes.

Various embodiments in accordance with the techniques described herein, including embodiments without metal snap domes or rubber domes, provide force response curves similar to the curve 210 of FIG. 2. Many tactile keyboard keys utilize snap ratios no less than 0.4 and no more than 0.6. Other tactile keyboard keys may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic.

For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
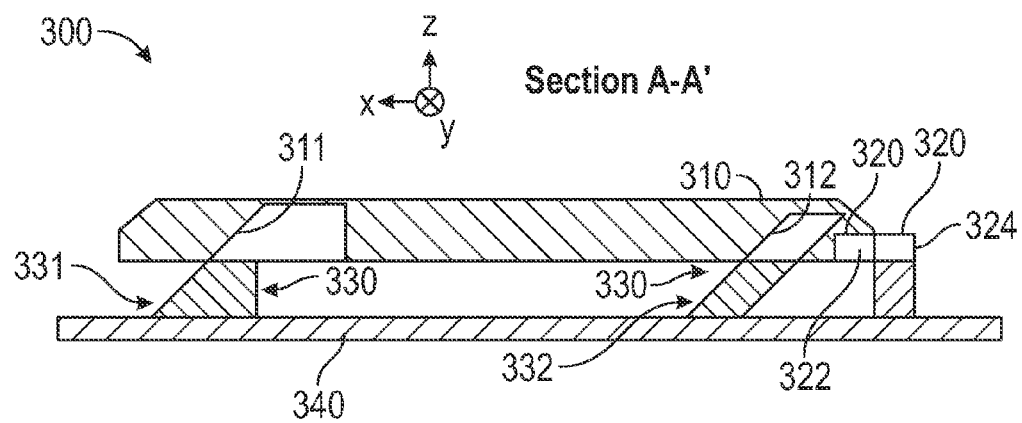
FIGS. 3A-3B are simplified side views of a first example touchsurface assembly configured in accordance with the techniques described herein.
Figure 3B:
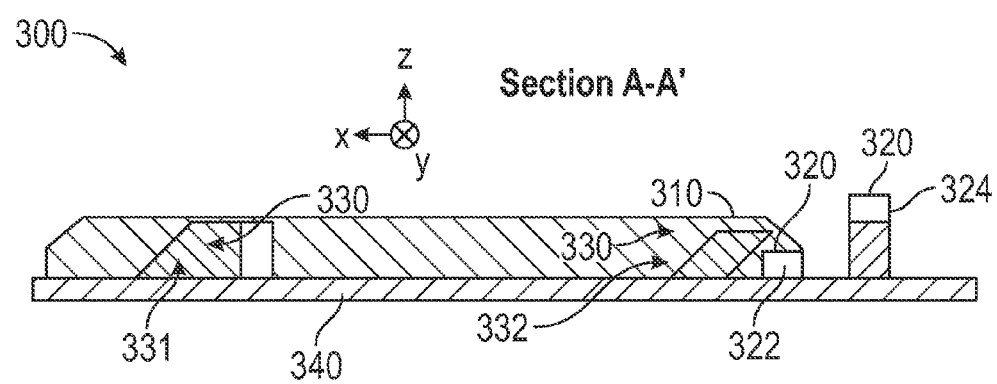

FIGS. 3A-3B are simplified cross-sectional views of a first example touchsurface assembly. The key assembly 300 may be used to implement various keys, including the key 122 of the keyboard 100. In the embodiment where FIGS. 3A-3B depict the key 122, these figures illustrate A-A' sectional views of the key 122. FIG. 3A shows the example key assembly 300 in an unpressed position and FIG. 3B shows the same key assembly 300 in a pressed position. The key assembly 300 may also be used in other devices utilizing keys, including keyboards other than the keyboard 100 and any other appropriate key-using device. Further, assemblies analogous to the key assembly 300 may be used to enable non-key touchsurface assemblies such as buttons, opaque touchpads, touchscreens, or any of the touchsurface assemblies described herein.

The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed a "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the example embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross-section(s) or comprise a plurality of magnetically coupled subcomponents having the same or different cross sections. For example, magnetically coupled component 322 or 324 may comprise a magnetic, box-shaped subcomponent disposed against a central portion of a ferrous, U-shaped subcomponent.

In some implementations, the magnetically coupled component 324 is physically attached to a bezel or base proximate to the keycap 310. The magnetically coupled component 322 is physically attached to the keycap and magnetically interacts with the magnetically coupled component 324. The physical attachment of the magnetically coupled components 322, 324 may be direct or indirect (indirectly being through one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 moves in the press direction (negative Z-direction) in response to a sufficiently large press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIG. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piecewise linear, or nonlinear sections, those having simple or complex curves or surfaces, or those including various convex and concave features. Similarly, the ramp contacting features on the keycap 310 may be simple or complex, and may comprise linear, piecewise linear, or nonlinear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

As a further example, embodiments which level their touchsurfaces may use various leveling techniques which use none, part, or all of the associate PTE mechanism.

Figure 4:
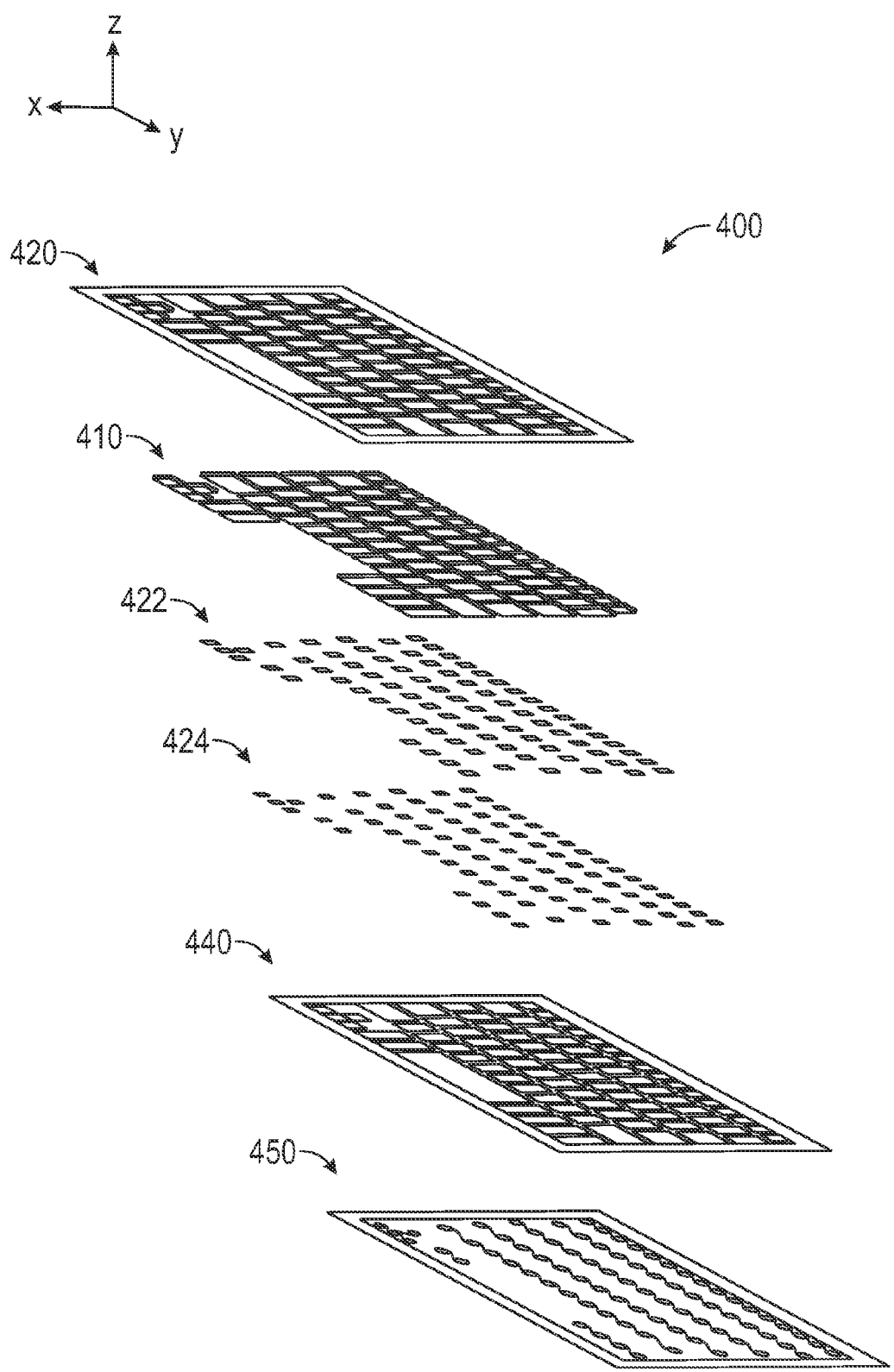
FIG. 4 shows an exploded view of an example keyboard in accordance with the techniques described herein.

FIG. 4 shows an exploded view of an example keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

Figure 5:
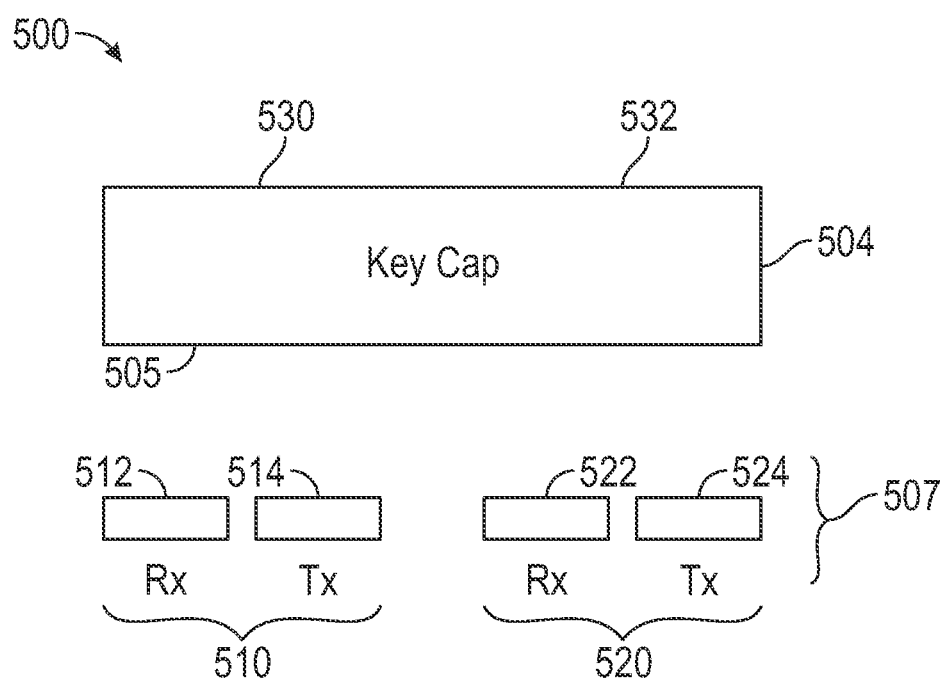
FIG. 5 is a schematic layout diagram of an exemplary extended key assembly including a movable key cap and two capacitive sensors in accordance with the techniques described herein.

FIG. 5 is a schematic layout diagram of an exemplary extended key assembly including a movable key cap having two (or more) capacitive sensors disposed beneath the bottom surface the key cap in accordance with the techniques described herein. More particularly, an exemplary key assembly 500 includes a movable key cap 504, a transmitter electrode 514 and a receiver electrode 512 defining a first pixel 510 configured to detect finger presence proximate a first region 530 of the key cap 504, and a transmitter electrode 524 and a receiver electrode 522 defining a second pixel 520 configured to detect finger presence proximate a second region 532 of the key cap 504. Each pixel 510, 520 is configured to detect the presence of a finger on or proximate a corresponding region of the key cap surface. Together, two or more pixels may be used to detect sliding finger motion or a gesture on the key cap surface. As discussed in greater detail below, the pixels 510, 520 may be formed as part of a sensor substrate 507 adhered to a bottom (underside) surface 505 of the key cap 504.

The ability to determine the location of the finger on the surface of a key allows the processing system associated with the keyboard to determine multiple input functions for a single key, depending on the location of the finger on the key cap during a keystroke. For example, in a first mode of an exemplary embodiment, the key functions as a spacebar regardless of the location of the finger on the spacebar key when the spacebar is pressed. In a second mode, the same spacebar key may be demarked with two (or more) different legends on two (or more) corresponding locations (regions) of the spacebar key. Thus, if the finger is located on the first region when the key is pressed, the processing system determines a first input function. If, on the other hand, the finger is located on the second region when the key is pressed, the processing system determines a second input function. This, in turn, allows the spacebar or other wide key (also referred to as an extended key) to perform multiple input functions, as described in greater detail below in conjunction with FIG. 10.

Figure 6:
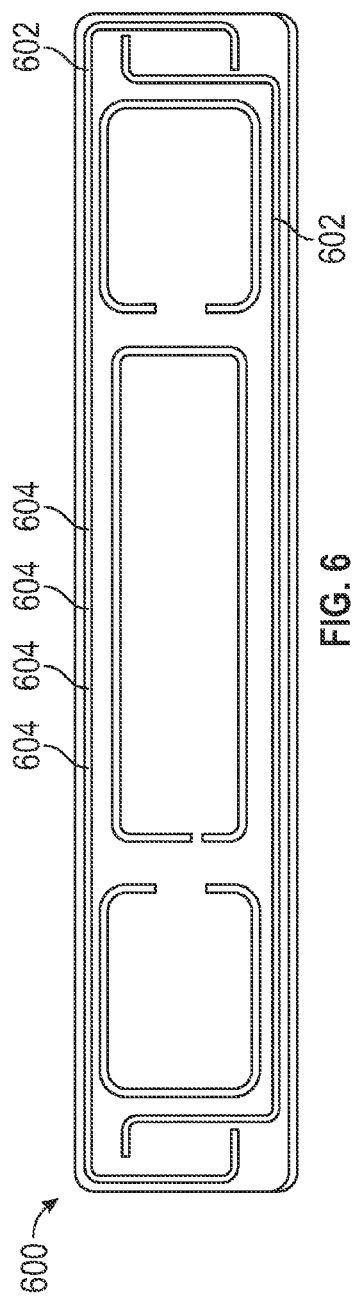
FIG. 6 is a plan view of the bottom (underside) of a traditional scissor-type key cap having snap in rigidity elements in accordance with the techniques described herein.

FIG. 6 is a plan view of the bottom (underside) of an exemplary traditional scissor-type key cap 600 (e.g., a space bar) having snap-in rigidity elements. More particularly, a plurality of wires 602 are attached to the underside surface of the key cap 600 using clips or hooks 604, as is known in the art. The hooks 604 extend from the bottom surface of the key cap and secure the wires 602 thereto, to thereby enhance the strength and rigidity of the key cap assembly.

Figure 7:
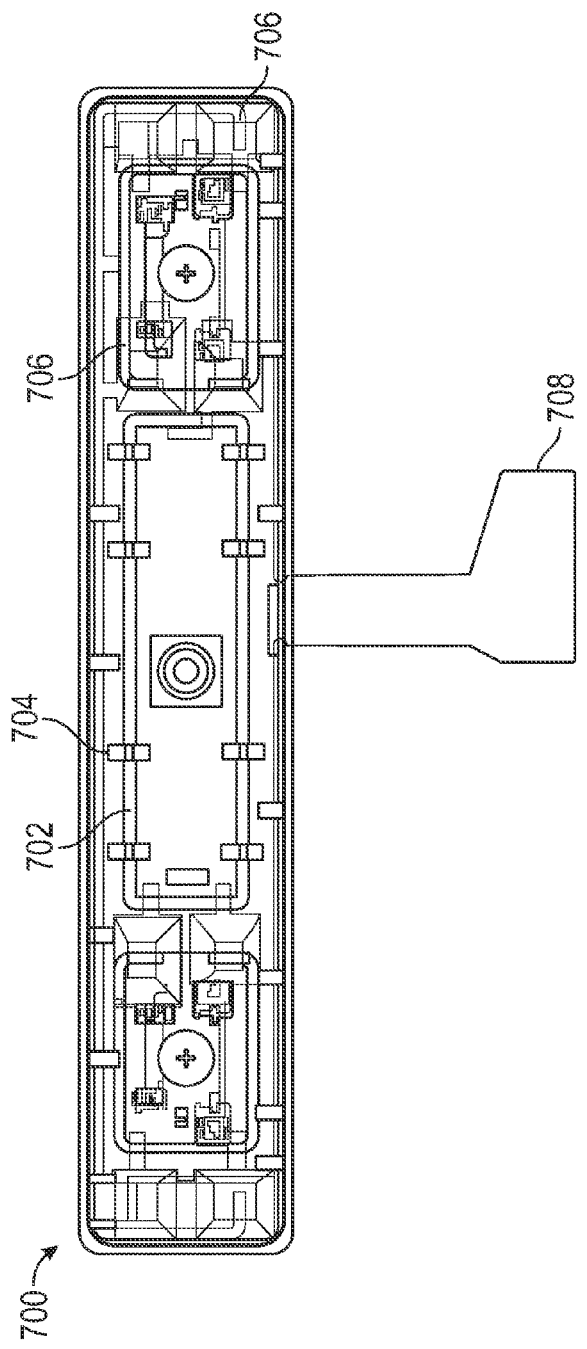
FIG. 7 is a plan view of the bottom (underside) of a traditional scissor-type key cap having snap in rigidity elements and further including hooks extending therefrom for attaching key motion mechanisms in accordance with the techniques described herein.

FIG. 7 is a plan view of the bottom (underside) of a key cap 700 having rigidity elements 702 attached via hooked extensions 704, and additional hooks 706 for attaching key motion mechanisms such as ramps, 4-bar linkages, and/or scissor mechanisms (not shown for clarity). A tail 708 is configured to attach the sensor electrodes (not shown) to a processing system.

Extended keys such as the space bar may comprise capacitor electrodes configured to detect the location of the finger on the key. The capacitive sensor electrodes may be disposed on a PET film sensor substrate which conforms to the underside of the key cap. In order to accommodate the various hooks for attaching rigidity elements and key motion mechanisms, the sensing substrate includes through holes, vias, voids, or other discontinuities through which the hooks extend. These discontinuities, however, can compromise sensor performance by introducing local non-uniformities into the sensor response.

Figure 8:
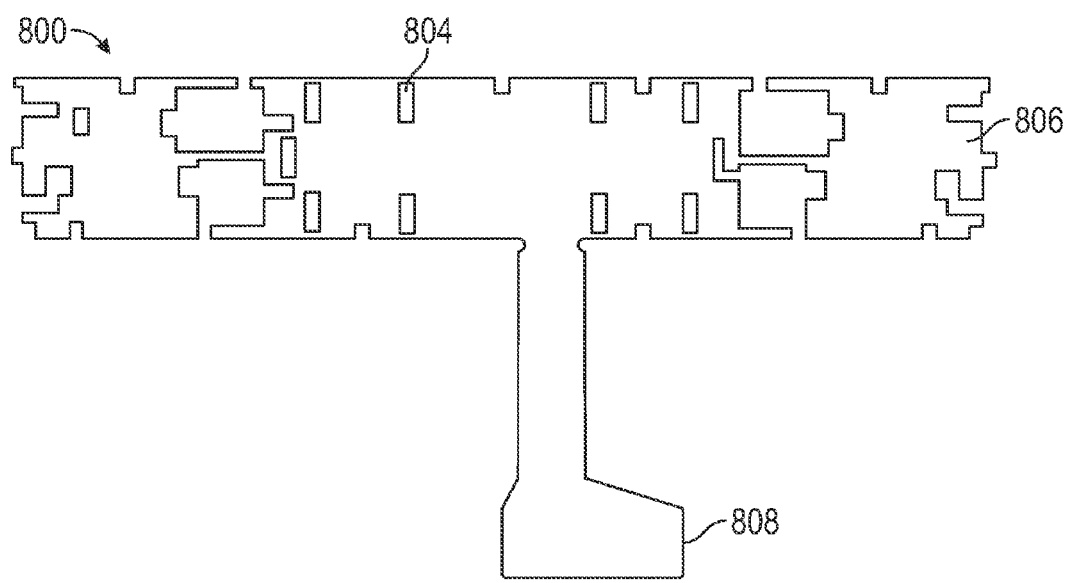
FIG. 8 is a plan view of a capacitive sensor substrate including holes for accommodating: i) snap-in rigidity elements; and ii) hooks for attachment to key motion linkages in accordance with the techniques described herein.

FIG. 8 is a plan view of a capacitive sensor substrate 800 including holes 804 for accommodating snap-in rigidity elements, and attachment features 806 for attachment to ramps, linkages, and the like. The sensor substrate 800 may also include a tail 808 for connecting the sensor substrate to a processor. As discussed above, the discontinuities and local non-uniformities produced by these holes tend to compromise the performance of the capacitive sensor.

Figure 9:
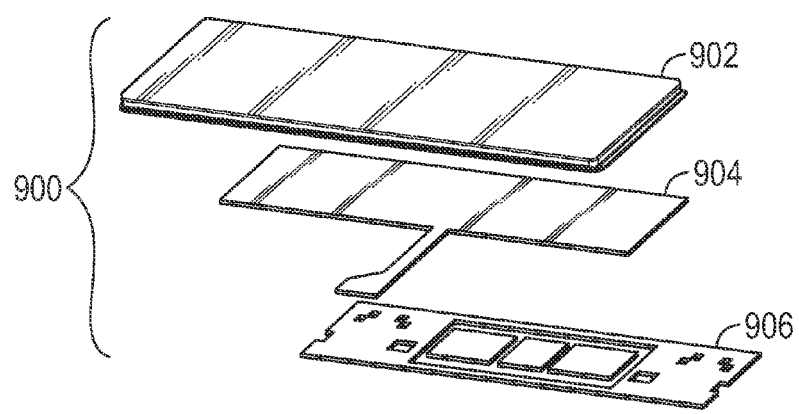
FIG. 9 is an exploded view of a key assembly stack up including a key cap, a continuous capacitive sensor, and a film metal layer sandwiched together in accordance with the techniques described herein

FIG. 9 is an exploded view of a key assembly stack-up or sandwich 900 including a key cap 902, a substantially continuous capacitive sensor substrate 904, and a conductive layer 906 (e.g., a metal film). This arrangement allows the underside of the key cap to be free from the attachment features associated with the key cap shown in FIG. 7, such that the sensor substrate may conform to the smooth undersurface of the key cap. This conformal arrangement reduces the non-uniformities associated with previous versions, thereby improving device performance. To facilitate the attachment of rigidity elements and key motion mechanisms, the film metal layer 906 is equipped with attachment features, as described in greater detail below in conjunction with FIGS. 10 and 11. While not shown in FIG. 9, an insulating layer (e.g. a film substrate) may be disposed between the sensor layer 904 and the film metal layer 906 to prevent undesired ohmic contact between the sensor and the film metal.

Figure 10:
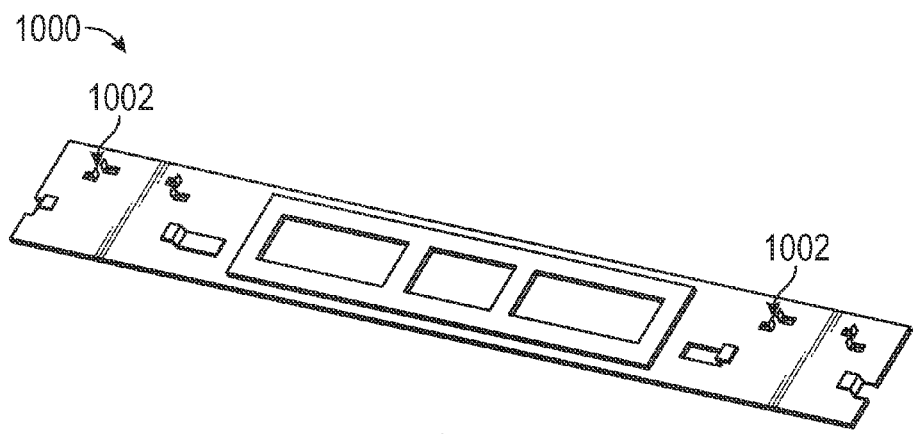
FIG. 10 is a perspective layout view of the film metal layer of FIG. 8, showing hooks for key motion linkages, and embossed rigidity elements in accordance with the techniques described herein.

FIG. 10 is a perspective layout view of a film metal layer 1000 generally analogous to the film metal layer 906 of FIG. 9, including attachment hooks 1002 for key motion linkages and rigidity elements 1004 to increase the overall structural strength of the resulting key assembly. In an embodiment, the film metal layer 1000 comprises a rigid plate and is substantially coextensive with the sensor substrate. Alternatively, the film metal may be smaller or larger that the sensor substrate.

With continued reference to FIG. 10, the film metal layer 1000 may be punched or coined to form the hooks 1002, and may be embossed to form the rigidity elements 1004.

Figure 11:
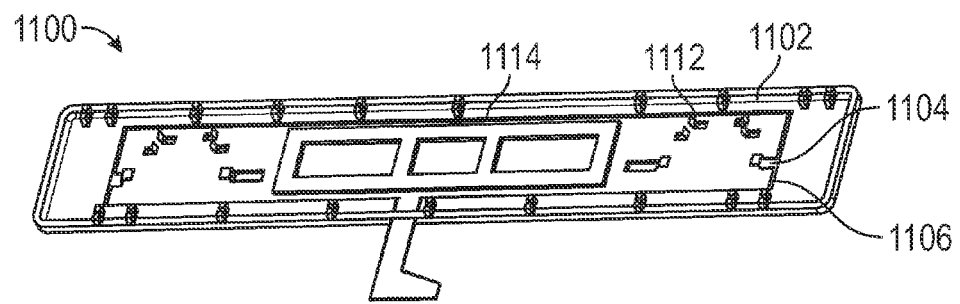
FIG. 11 is a perspective view of the key assembly stack up of FIG. 8 shown fully assembled in accordance with the techniques described herein.

FIG. 11 is a perspective view of the key assembly stack up 1100 generally analogous to the stack-up 900 of FIG. 9, shown in the assembled condition. More particularly, the stack-up 1100 includes a key cap 1102, a sensor substrate 1104 attached to an underside of the key cap, and a film metal layer 1106 overlaid onto the sensor substrate. The film metal layer 1106 includes hooks 1112 and rigidity elements 1114.

Figure 12:
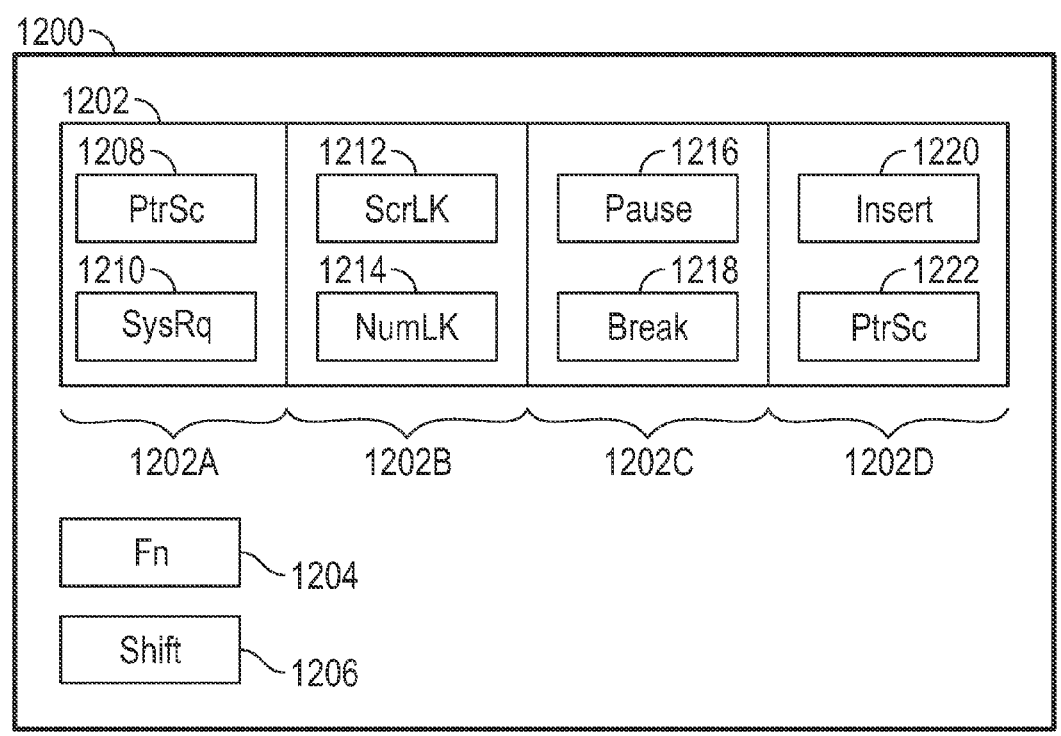
FIG. 12 is a schematic layout view of a multi-function space bar in accordance with the techniques described herein.

FIG. 12 is a schematic layout view of a portion of a keyboard 1200 including a multi-function key (e.g., space bar) 1202, a Fn key 1204, and a Shift key 1206. It will be appreciated that various keyboard keys which are used infrequently may be merged onto a space bar or other extended key. By representing one or more keys as discrete sub-regions on the space bar, their functionalities can be invoked by simultaneously: i) touching the corresponding sub-region of the space bar; and ii) pressing a mode key, such as Fn key 1204 or Shift key 1206.

More particularly and with continued reference to FIG. 12, the space bar 1202 may be divided into any number of sub-regions, for example sub-regions 1202A-D. In the illustrated example, sub-region 1202A may include a first portion corresponding to a PtrSc key 1206 and a second portion corresponding to a SysRq key 1210; sub-region 1202B may include a first portion corresponding to a ScrLK key 1212 and a second portion corresponding to a NumLK key 1214; sub-region 1202C may include a first portion corresponding to a Pause key 1216 and a second portion corresponding to a Break key 1218; and sub-region 1202A may include a first portion corresponding to an Insert key 1220 and a second portion corresponding to an Alt key 1222.

A keyboard input device is thus provided with a plurality of key assemblies, at least one of the key assemblies comprising: a key cap having a top surface configured to be pressed by a user; a rigid conductive substrate (e.g., metal) coupled to a bottom surface of the key cap; a translation mechanism configured to allow translation of the key responsive to user input; and a capacitive sensor substrate disposed between the key cap and the rigid conductive substrate, the capacitive sensor substrate comprising a plurality of sensor electrodes configured to detect input objects in a sensing region of the key assembly.

In an embodiment, the translation mechanism is coupled to the bottom surface of the keycap.

In an embodiment, the at least one key is selected from the group of keys consisting of: Tab, Caps Lock, Shift, Control, Enter, and Space Bar.

In an embodiment, the rigid conductive substrate comprises a conductive coating overlying a non-conductive substrate (e.g., plastic).

In an embodiment, the rigid conductive substrate comprises at least one rigidity enhancing feature, such as an embossed region of the rigid conductive substrate.

In an embodiment, the rigid conductive substrate comprises a plurality of mating features for mechanical coupling to the translation mechanism.

In an embodiment, the plurality of mating features are configured to for coupling to at least one of a scissor linkage and a 4-bar linkage.

In an embodiment, the rigid conductive substrate is substantially co-extensive with the capacitive sensor substrate.

In an embodiment, wherein the rigid conductive substrate comprises a continuous conductive surface substantially devoid of non-conductive areas.

In an embodiment, the sensor substrate is communicatively coupled to a processing system configured to: operate the sensor electrodes in at least one of an absolute or trans-capacitive sensing mode; determine positional information for input objects in the sensing region of the key assembly; and determine depression of the key assembly.

In an embodiment, the processing system is configured to determine depression of the key assembly based on a conductive endstop disposed beneath the key assembly contacting at least one of sensor electrodes on the capacitive sensor substrate.

In an embodiment, the rigid conductive substrate is maintained at a constant potential by one of the sensor electrodes extending from the capacitor sensor substrate and ohmically contacting the rigid conductive substrate.

In an embodiment, the rigid conductive substrate is maintained at a constant potential through a connection to one of: a chassis associated with the input device; and system ground.

In an embodiment, the top surface of the key cap comprises indicia indicating a plurality of keyboard functions enabled by: activating a modifier key; and a press from an input object in an area of the key cap overlapping the indicia.

A keyboard input device is provided which includes at least one key assembly comprising: a key cap having a top surface configured to be pressed by a user; a metallic substrate coupled to a bottom surface of the key cap, the metallic substrate including raised features for connecting to a translation mechanism; a capacitive sensor substrate disposed between the key cap and the metallic substrate and configured to detect input objects in a sensing region of the key assembly; and a processing system communicatively coupled to the capacitive sensor substrate. The processing system is configured to: determine positional information for input objects in the sensing region of the key assembly; and determine depression of the key assembly.

In an embodiment, the at least one key assembly comprises a Space Bar.

A key assembly is also provided for use in a keyboard input device. The key assembly includes: a capacitive sensor substrate comprising a plurality of sensor electrodes configured to detect input objects in a sensing region of the key assembly and having a first surface overlaying an undersurface of a key cap; and a metallic substrate overlaying and substantially coextensive with a second surface of the capacitive sensor substrate, the metallic substrate including mating features for connecting to a translation mechanism.

Thus, the techniques described herein can be used to implement any number of devices utilizing different touchsurface assemblies, including a variety of keyboards each comprising one or more key assemblies in accordance with the techniques described herein. Some components may be shared when multiple touchsurfaces are placed in the same device. For example, the base may be shared by two or more touchsurfaces. As another example, the keyswitch sensor may be shared through sharing sensor substrates, sensor electrodes, or the like.

The implementations described herein are meant as examples, and many variations are possible. As one example, any appropriate feature described with one implementation may be incorporated with another. As a first specific example, any of the implementations described herein may or may not utilize a finishing tactile, aesthetic, or protective layer. As a second specific example, ferrous material may be used to replace magnets in various magnetically coupled component arrangements.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions. Thus, the techniques described in the various implementations herein may be used in conjunction with each other, even where the function may seem redundant. For example, some embodiments use springs to back-up or augment magnetically-based ready/return mechanisms.

What is claimed is:

1. A keyboard input device comprising:
   a mode key; and
   a spacebar key comprising:
      a spacebar key cap having a top surface comprising a first region and a second region, wherein the first region and the second region are configured to be pressed by a user;
      a rigid conductive substrate coupled to a bottom surface of the spacebar key cap;
      a translation mechanism configured to allow translation of the spacebar key cap responsive to user input; and
      a capacitive sensor substrate disposed between the spacebar key cap and the rigid conductive substrate, the capacitive sensor substrate comprising a plurality of sensor electrodes configured to detect one or more input objects proximate the first region of the spacebar key cap and the second region of the spacebar key cap, and
   wherein, when the mode key is in a pressed position, the first region of the spacebar key cap corresponds to a first input function and the second region of the spacebar key cap corresponds to a second input function, and
   wherein the first input function is different from the second input function.

2. The keyboard input device of claim 1, wherein the rigid conductive substrate comprises metal.

3. The keyboard input device of claim 1, wherein the translation mechanism is coupled to the bottom surface of the key cap.

4. The keyboard input device of claim 1, wherein the rigid conductive substrate comprises a conductive coating overlying a non-conductive substrate.

5. The keyboard input device of claim 4, wherein the non-conductive substrate comprises plastic.

6. The keyboard input device of claim 1, wherein the rigid conductive substrate comprises at least one rigidity enhancing feature.

7. The keyboard input device of claim 6, wherein the rigidity enhancing feature comprises an embossed region of the rigid conductive substrate.

8. The keyboard input device of claim 1, wherein the rigid conductive substrate comprises a plurality of attachment features for mechanical coupling to the translation mechanism.

9. The keyboard input device of claim 1, wherein the plurality of attachment features are configured to for coupling to at least one of a scissor linkage and a 4-bar linkage.

10. The keyboard input device of claim 1, wherein the rigid conductive substrate is substantially co-extensive with the capacitive sensor substrate.

11. The keyboard input device of claim 10, wherein the rigid conductive substrate comprises a continuous conductive surface substantially devoid of non-conductive areas.

12. The keyboard input device of claim 1, wherein the sensor substrate is communicatively coupled to a processing system, the processing system configured to:
   operate the sensor electrodes in at least one of an absolute or trans-capacitive sensing mode;
   determine positional information for input objects in a sensing region of the key assembly; and
   determine depression of the key assembly.

13. The keyboard input device of claim 1, wherein the processing system is configured to determine depression of the key assembly based on a conductive endstop disposed beneath the key assembly contacting at least one of sensor electrodes on the capacitive sensor substrate.

14. The keyboard input device of claim 1, wherein the rigid conductive substrate is maintained at a constant potential by one of the sensor electrodes extending from the capacitor sensor substrate and ohmically contacting the rigid conductive substrate.

15. The keyboard input device of claim 14, wherein the rigid conductive substrate is maintained at a constant potential through a connection to one of: a chassis associated with the input device; and system ground.

16. The keyboard input device of claim 1, wherein the top surface of the key cap comprises indicia indicating a plurality of keyboard functions enabled by: activating a modifier key; and a press from an input object in an area of the key cap overlapping the indicia.

17. A keyboard input device comprising:
   a mode key;
   a spacebar key comprising:
      a spacebar key cap having a top surface comprising a first region and a second region, wherein the first region and the second region are configured to be pressed by a user;
      a metallic substrate coupled to a bottom surface of the spacebar key cap, the metallic substrate including raised features for connecting to a translation mechanism;
      a capacitive sensor substrate disposed between the spacebar key cap and the metallic substrate and configured to detect one or more input objects proximate the first region of the spacebar key cap and the second region of the spacebar key cap; and
   a processing system communicatively coupled to the mode key and the spacebar key, the processing system configured to:
      perform, when the mode key is in a pressed position and an input object is proximate the first region of the spacebar key cap, a first input function;
      perform, when the mode key is in the pressed position and the input object is proximate the second region of the spacebar key cap, a second input function, wherein the first input function is different from the second input function;
      determine positional information for the one or more input objects in a sensing region of a key assembly; and
      determine depression of the key assembly.

* * * * *